(12) United States Patent
Malek et al.

(10) Patent No.: US 8,993,899 B2
(45) Date of Patent: Mar. 31, 2015

(54) SYSTEMS OF AN ELECTRONIC DEVICE AND METHODS FOR MANUFACTURING THE SAME

(71) Applicant: Apple Inc., Cupertino, CA (US)

(72) Inventors: Shayan Malek, San Jose, CA (US);
Benjamin J. Pope, Sunnyvale, CA (US);
Daniel W. Jarvis, Sunnyvale, CA (US);
Tang Yew Tan, Palo Alto, CA (US);
Richard H. Dinh, San Jose, CA (US);
Robert J. Steinfeld, Los Gatos, CA (US); Ramachandran Chundru, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/248,150

(22) Filed: Apr. 8, 2014

(65) Prior Publication Data

US 2014/0218606 A1  Aug. 7, 2014

Related U.S. Application Data

(63) Continuation of application No. 13/370,881, filed on Feb. 10, 2012, now Pat. No. 8,710,376.

(60) Provisional application No. 61/529,911, filed on Aug. 31, 2011.

(51) Int. Cl.
| | | |
|---|---|---|
| *H05K 9/00* | (2006.01) | |
| *H04M 1/02* | (2006.01) | |
| *H04N 5/225* | (2006.01) | |
| *H05K 1/02* | (2006.01) | |

(52) U.S. Cl.
CPC .......... *H05K 9/0064* (2013.01); *H04M 1/0274* (2013.01); *H04M 1/0277* (2013.01); *H04N 5/2254* (2013.01); *H05K 1/0215* (2013.01); *H05K 1/0216* (2013.01); *H05K 2201/0707* (2013.01)
USPC .......................... 174/382; 455/300; 455/575.1

(58) Field of Classification Search
USPC ................................ 174/382; 455/300, 575.1
See application file for complete search history.

(56) References Cited

U.S. PATENT DOCUMENTS

| | | | |
|---|---|---|---|
| 5,748,449 A | 5/1998 | Tahmassebpur | |
| 6,162,989 A | 12/2000 | Garner | |
| 6,627,811 B2 | 9/2003 | Rubenstein et al. | |
| 6,751,473 B1* | 6/2004 | Goyal et al. | 455/556.1 |
| 6,951,984 B2 | 10/2005 | Buchberger | |
| 6,953,889 B2 | 10/2005 | Hanks | |
| 7,146,200 B2* | 12/2006 | Park et al. | 455/575.3 |
| 7,177,161 B2 | 2/2007 | Shima | |
| 7,820,918 B2* | 10/2010 | Chang | 174/384 |
| 7,856,259 B2* | 12/2010 | Bergh | 455/575.5 |
| 7,976,226 B2 | 7/2011 | Jeon et al. | |
| 7,994,434 B2 | 8/2011 | Benner et al. | |
| 8,192,209 B1 | 6/2012 | Li et al. | |
| 8,273,987 B2 | 9/2012 | Saito et al. | |
| 8,514,589 B2 | 8/2013 | Mikami | |

(Continued)

*Primary Examiner* — Hung V Ngo

(57) ABSTRACT

Various systems of an electronic deice and methods for manufacturing the same are provided. In some embodiments, a routing assembly is provided that may not only route a cable along a circuit board, but that may also shield and electronic component or secure an electronic component to the circuit board. In some other embodiments, there is provided a mechanism for electrically coupling two components of an electronic device that may also be visually appealing in the context of other portions of the electronic device.

26 Claims, 12 Drawing Sheets

(56) References Cited

U.S. PATENT DOCUMENTS

| | | |
|---|---|---|
| 8,519,275 B2 | 8/2013 | Hashimoto et al. |
| 8,576,569 B2 | 11/2013 | Malek et al. |
| 2006/0046680 A1* | 3/2006 | Hashizume et al. ........ 455/300 |
| 2006/0046798 A1* | 3/2006 | Corrigan et al. .......... 455/575.5 |
| 2008/0020813 A1* | 1/2008 | Choi et al. ............... 455/575.3 |
| 2011/0052180 A1* | 3/2011 | Pei et al. .................. 396/439 |
| 2011/0130177 A1* | 6/2011 | Halliday ................... 455/575.1 |
| 2011/0180315 A1 | 7/2011 | Pedoeem et al. |
| 2012/0082443 A1 | 4/2012 | Yamamoto |
| 2012/0120612 A1 | 5/2012 | Tran |
| 2012/0194393 A1 | 8/2012 | Uttermann et al. |
| 2012/0281368 A1 | 11/2012 | Nicol et al. |
| 2014/0182925 A1* | 7/2014 | Jang ........................ 174/382 |

\* cited by examiner

SYSTEMS OF AN ELECTRONIC DEVICE AND METHODS FOR MANUFACTURING THE SAME

This application a continuation of U.S. patent application Ser. No. 13/370,881, filed Feb. 10, 2013, which claims the benefit of U.S. Provisional Patent Application No. 61/529,911, tiled Aug. 31, 2011. This application claims the benefit of and claims priority to U.S. patent application Ser. No. 13/370,881, filed Feb. 10, 2013, and U.S. provisional patent application No. 61/529,911, filed Aug. 31, 2011, which are hereby incorporated by reference herein in their entireties.

FIELD OF THE INVENTION

This can relate to various systems of an electronic device and methods for manufacturing the same.

BACKGROUND

Some electronic devices include a cable that may be routed along a surface of a circuit board. However, routing components that are conventionally used to route the cable along a particular path have no other function and often take up valuable real estate on the circuit board. Moreover, some electronic devices often include components that must be electrically coupled to other components for shielding or grounding purposes. However, mechanisms that are conventionally used to electrically couple device components often are visually unappealing.

SUMMARY

Various systems of an electronic device and methods for manufacturing the same are provided.

In some embodiments, there is provided an electronic device that may include a circuit board, a cable, a device component, and a first routing assembly. The first routing assembly may route the cable along the circuit board. The first routing assembly may also shield the device component from interference.

For example, in some embodiments, the device component may be coupled to a first surface of the circuit board, and the first routing assembly may include a shield body positioned above the electronic device and the first surface of the circuit board, as well as a shield finger extending away from the shield body. A first end of the shield finger may be coupled to the shield body and a second end of the shield finger may be coupled to the first surface of the circuit board. A first portion of the shield finger may extend between the first end and the second end, and the first portion of the shield finger may be positioned between the first surface of the circuit board and at least a portion of the cable. Alternatively, at least a portion of the cable may be positioned between the first portion of the shield finger and the first surface of the circuit board.

In other embodiments, there is provided an electronic device that may include a circuit board, a cable, a device component, and a first routing assembly. The first routing assembly may route the cable along the circuit board. The first routing assembly may also secure the device component to the circuit board.

For example, in some embodiments, the first routing assembly may include a body portion and a securing portion. The body portion may include a top surface, a bottom surface, and at least one side surface extending between the top surface and the bottom surface. The securing portion may include a first end coupled to the bottom surface of the body portion and a free end extending away from the bottom surface. The free end of the securing portion may be secured to the circuit board, and at least a portion of the device component may be secured between the bottom surface of the body portion and a first surface of the circuit board. The securing portion may be a screw or a nail or an adhesive. The at least one side surface of the body portion may route at least a portion of the cable along the at least one side surface. The at least one side surface may be straight or curved between the top surface and the bottom surface of the body portion.

In yet other embodiments, there is provided an electronic device that may include a housing having a housing wall with an opening therethrough. The electronic device may also include a device component assembly positioned at least partially within the housing, where a first component of the device component assembly is positioned at least partially within the opening. The electronic device may also include a trim positioned at least partially within the opening and about at least a portion of the first component. Moreover, the electronic device may also include a grounded device component and a bridge that is electrically coupled to the trim and to the grounded device component.

For example, in some embodiments, the bridge includes an electrostatic discharge adhesive. The bridge may also include a cosmetic layer positioned over an entire side of the conductive layer. The color of the cosmetic layer may match the color of at least a portion of the trim or a portion of the grounded device. The portion of the trim and the portion of the grounded device are visible from the interior of the housing. The device component assembly may be a camera component assembly, and the first component may be a lens component of the camera component assembly.

In still yet other embodiments, there is provided an electronic device that may include a device component assembly having a substrate, a first component coupled to a top surface of the substrate, and a shield provided about at least a portion of the first component. The shield may be electrically coupled to the substrate. The electronic device may also include a wrap having an inner non-conductive layer provided along at least one side surface of the substrate, where the inner non-conductive layer may prevent at least one exposed trace on the at least one side surface of the substrate from being shorted. The wrap may also include a conductive layer provided about the inner non-conductive layer, where the conductive layer may be electrically coupled to the shield.

For example, in some embodiments, the shield may be electrically coupled to a portion of the substrate for grounding the shield. Moreover, the conductive layer may be electrically coupled to the shield for grounding the conductive layer. A portion of the conductive layer may extend past the inner non-conductive layer adjacent to a location where the substrate is coupled to at least one of the shield and the first component. The conductive layer may be an electrostatic discharge adhesive. The wrap may also include a cosmetic layer provided over an entire side of the conductive layer. Moreover, in sonic embodiments, the electronic device may also include a stiffener positioned below the substrate for supporting the substrate, where the conductive layer is electrically coupled to the stiffener for grounding the stiffener. The inner non-conductive layer may extend down under the stiffener and back up along another side surface of the substrate. Moreover, in some embodiments a hoot component may be provided about at least a portion of the stiffener, where the boot component absorbs physical shock and electrically couples the stiffener to a grounding component. For example, the boot component may be an elastomeric connector. The device component assembly may be a camera, component assembly, and the first component may be a motor Liar a lens component of the camera component assembly.

BRIEF DESCRIPTION OF THE DRAWINGS

The above and other aspects of the invention, its nature, and various features will become more apparent upon consideration of the following detailed description taken in conjunction with the accompanying drawings, in which like reference characters may refer to like parts throughout, and in which.

DETAILED DESCRIPTION

Various systems of an electronic device and methods for manufacturing the same are provided and described with reference to FIGS. 1-16.

The following discussion describes various embodiments of an electronic device that may include various systems. The term "electronic device" can include, but is not limited to, music players, video players, still image players, game players, other media players, music recorders, video recorders, cameras, other media recorders, radios, medical equipment, calculators, cellular telephones, other wireless communication devices, personal digital assistants, remote controls, pagers, laptop computers, desktop computers, tablets, servers, printers, or combinations thereof. In some cases, the electronic device may perform a single function (e.g., an electronic device dedicated to capturing images) and in other eases, the electronic device may perform several functions (e.g., an electronic device that captures images, plays music, displays video, stores pictures, and receives and transmits telephone calls).

The electronic device may generally be any portable, mobile, hand-held, or miniature electronic device so as to allow a user, for example, to listen to music, play games, record videos, take pictures, and/or conduct communications operations (e.g., telephone calls) wherever he or she travels. Some miniature electronic devices may have a form factor that is smaller than that of hand-held electronic devices, such as an iPod™ available by Apple Inc. of Cupertino, Calif. Illustrative miniature electronic devices can be integrated into various objects that include, but are not limited to watches, rings, necklaces, belts, accessories for belts, headsets, accessories for shoes, virtual reality devices, other wearable electronics, accessories for sporting equipment, accessories for fitness equipment, key chains, or any combination thereof. Alternatively, electronic devices that incorporate the various systems may not be portable at all.

Figure 1:
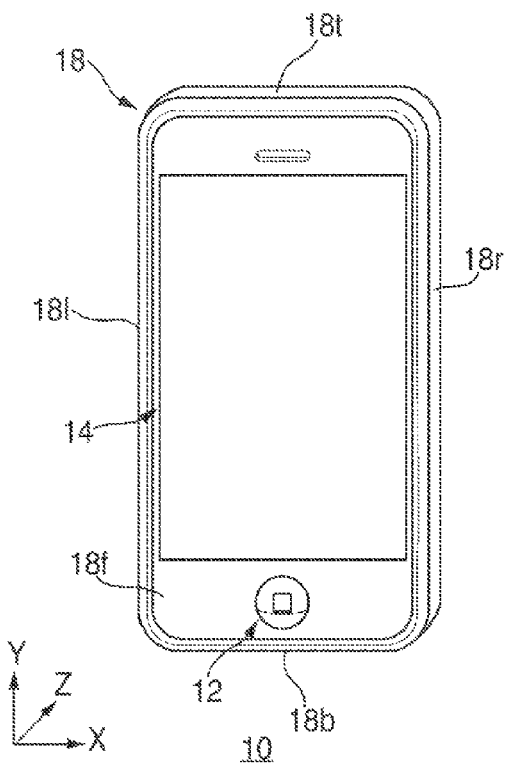
FIG. 1 is a front top, right perspective view of an exemplary electronic device, in accordance with some embodiments of the invention.
Figure 2:
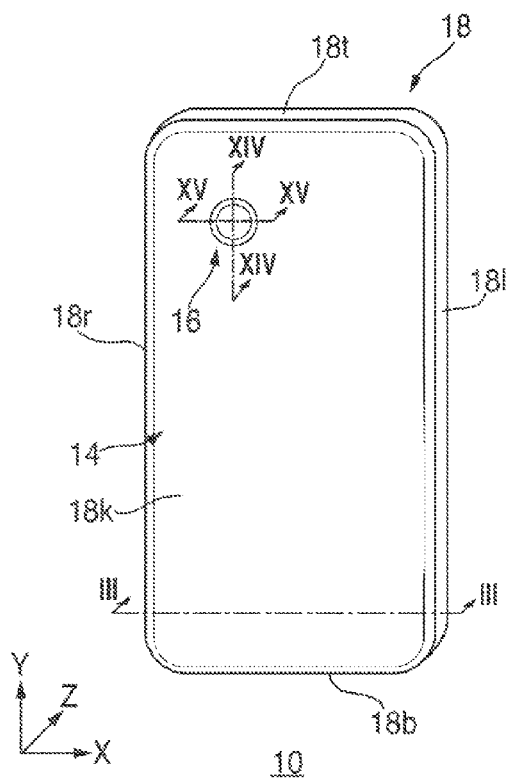
FIG. 2 is a back, top, left perspective view of the electronic device of FIG. 1.

FIGS. 1 and 2 are perspective views of an illustrative electronic device 10 that may include one or more systems in accordance with sonic embodiments of the invention. Electronic device 10 can include at least one user input component assembly 12 that may allow a user to interlace with device 10, at least one device output component assembly 14 that may provide the user with device generated information, at least one camera component assembly 16 that may capture one or more still or video images, and a protective housing 18 that may at least partially enclose one or more of the input, output, and camera component assemblies of device 10. Housing 18 may be any suitable shape and may include any suitable number of walls. In some embodiments, as shown in FIGS. 1 and 2, for example, housing 18 may be of a generally hexahedral shape and may include as top wall 18*t*, a bottom wall 18*b* that may be opposite top wall 18*t*, a left wall 18*l*, a right wall 18*r* that may be opposite left wall 18*l*, a front wall 18*f*, and a back wall 18*k* that may be opposite front wall 18*f*.

Component assemblies 12 and 14 can include any type of component assembly operative to receive and/or transmit digital and/or analog data (e.g., audio data, video data, other types of data, or a combination thereof). Input component assembly 12 may include any suitable input mechanism, such as, for example, one or more sliding switches, buttons, keypads, track balls, joysticks, dials, scroll wheels, touch screen displays, electronics for accepting audio and/or visual information, antennas, infrared ports, or combinations thereof.

Output component assembly 14 may include any suitable output mechanism, such as, for example, one or more audio speakers headphones, audio line-outs, visual displays, antennas, infrared ports, rumblers, vibrators, or combinations thereof. It should be noted that one or more input component assemblies 12 and one or more output component assemblies 14 may sometimes be referred to collectively herein as an input/output ("I/O") interface. It should also be noted that input component assembly 12 and output component assembly 14 may sometimes be a single I/O component, such as a touch screen that may receive input information through a user's touch of a display screen and that may also provide visual information to a user via that same display screen.

Camera component assembly 16 may include any suitable assembly that may be operative to capture one or more images of the surrounding environment of electronic device 10. For example, camera component assembly 16 may include any number of optical or digital lenses for capturing light reflected by the user's environment as an image. The captured light may be stored as an individual distinct image or as consecutive video frame images of a recording (e.g., several video frames including a primary frame and one or more subsequent frames that may indicate the difference between the primary frame and the subsequent frame).

In some embodiments, as shown in FIGS. 3-13, for example, electronic device 10 may include a system for routing a cable within housing. 18 and amongst various components. As shown, device 10 may include at least one electrically conducting cable 20 that may provide an electrical connection between two or more electronic components of electronic device 10. For example, cable 20 may include one or more wires and may be any suitable type of connector or cable, including a flexible cable (e.g., a "flex" cable), a coaxial cable (e.g., a "coax" cable), a multi-core cable, a shielded cable, a single cable, a twisted pair cable, a twisting cable, and the like, which may route one or more electrical signals from a first electrical component of device 10 to a second electrical component of device 10.

Figure 3:
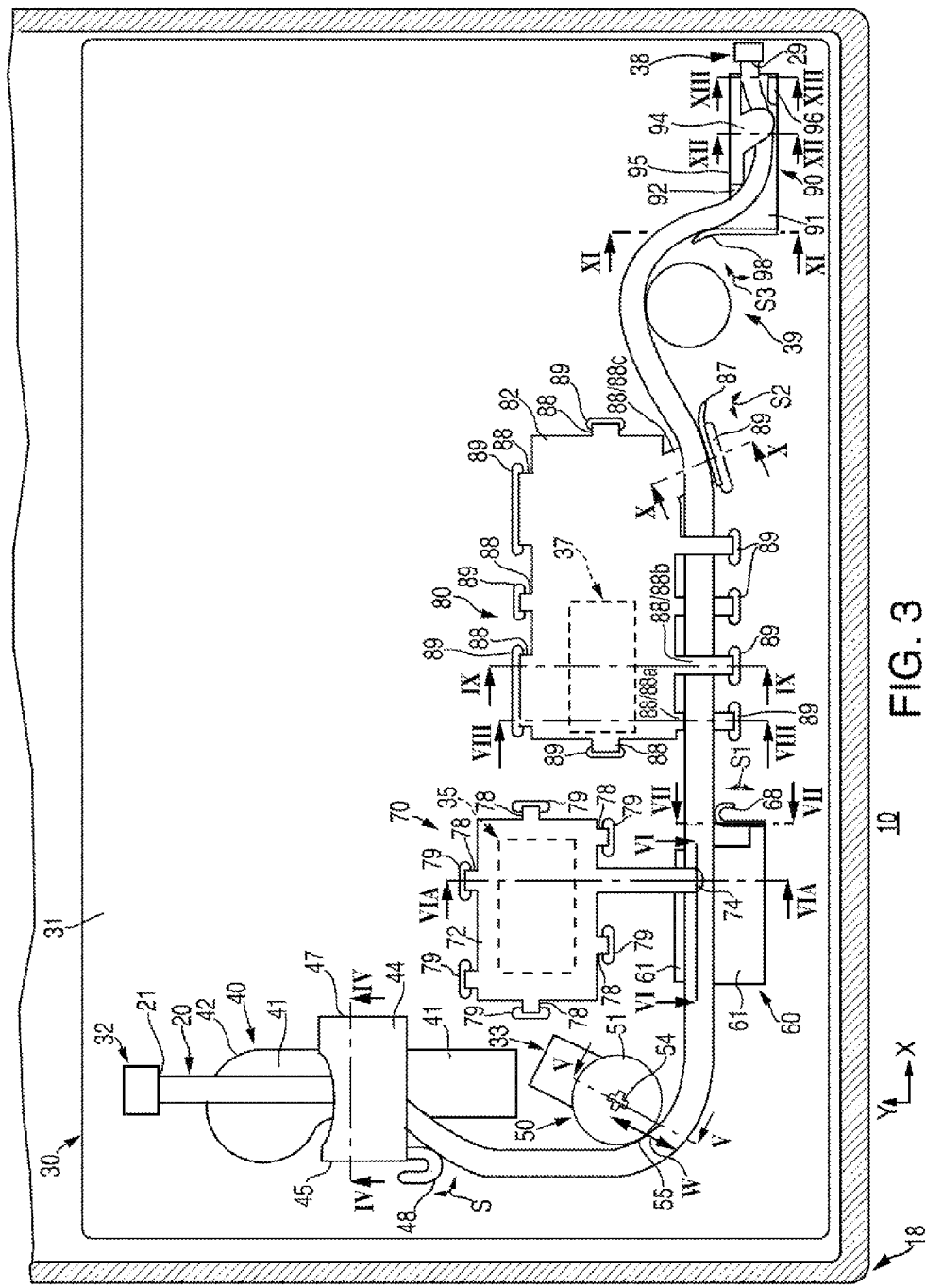
FIG. 3 is a cross-sectional view of a portion of the electronic device of FIGS. 1 and 2, taken from line of FIG. 2.

As shown in FIG. 3, for example, electronic device 10 may also include a circuit board 30, on which one or more electrical components may be mounted. Circuit board 30 may be a central or primary printed circuit board ("PCB") of electronic device 10, and may also be known as a main circuit board, motherboard, mainboard, baseboard, system board, planar board, or logic board. Circuit board 30 may provide one or more attachment points to various electrical components of device 10. Generally, most of the basic circuitry and components required for electronic device 10 to function may be onboard or coupled (e.g., via one or more cables, bond pads, leads, terminals cables, wires, contact regions, etc.) to circuit board 30. For example, cable 20 may be electrically coupled at a first cable end 21 to a first electrical component 32 and at a second cable end 29 to a second electrical component 38. Each one of components 32 and 38 may be mounted or otherwise coupled to a top surface 31 of circuit board 30. Each one of components 32 and 38 may include one or more chipsets or specialized groups of integrated circuits. For example, circuit board 30 may include two components or chips, such as a Northbridge and Southbridge. Although in other embodiments, these chips may be combined into a single component. Each one of components 32 and 38 may also be one of various other types of component, including, but not limited to a processor, memory, power supply, communications circuitry, input component, output component, camera component, and combinations thereof. Although each one of components 32 and 38 are shown to be coupled to top surface 31 of circuit board 30, it is to be understood that either one or both of first cable end 21 and second cable end 20 of cable 20 may terminate at an electrical component of device 10 that is mounted to another surface of circuit board or that is not mounted to circuit board 30 at all. Alternatively, one or both of cable ends 21 and 29 may be directly coupled to circuit board 30.

Cable 20 may be routed from first cable end 21 along and/or above top surface 31 of circuit board 30, to second cable end 29. In some embodiments, at least a portion of cable 20 may be inherently stiff, such that cable 20 may naturally tend to be disposed in a straight line, or with a particular curvature corresponding to features of conductors within cable 20, or to a manufacturing process used for creating cable 20). To ensure that cable 20 may=be properly routed within device 10 (e.g., within housing 18) device 10 can include one or more primary routing component assemblies that may be configured to retain, guide, or otherwise assist with routing cable 10 in one or more directions. Moreover, device 10 can include one or more secondary routing component assemblies that may be configured to perform a primary function for device 10 other than routing cable 20, but, due to their geometry and position within device 10, each secondary routing component assembly may serve to assist with routing cable 20 in one or more ways. For example, cable 20 may be routed above, below, along, through, or around Various components or systems of device 10, such as components or systems that may be coupled to top surface 31 of circuit board 30 (e.g., components 33, 35, 37, and 39, each of which may be any suitable component of device 10, such as an electronic component that may be suitable for providing any portion of input component assembly 12, output component assembly 14, and/or camera component assembly 16, and/or such as any suitable non-electronic component of device 10 that may be secured to circuit board 30).

Figure 4:
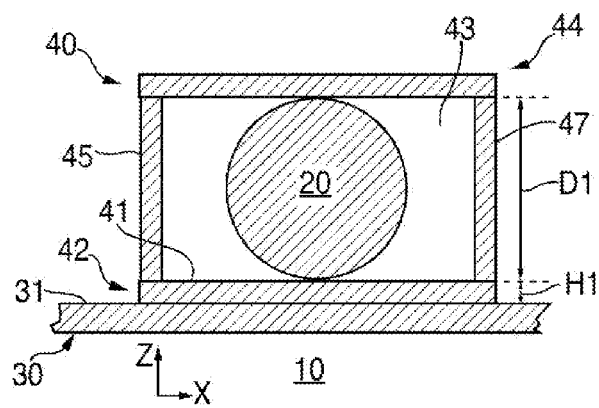
FIG. 4 is a cross-sectional view of a portion of the electronic device of FIGS. 1-3, taken from line IV-IV of FIG. 3.

As shown in FIGS. 3 and 4, device 10 may include a first routing component assembly 40 for guiding cable 20 in at least one direction. First muting component assembly 40 may be coupled to top surface 31 of circuit board 30 and may be positioned such that cable 20 may be forced or directed by component assembly 40 to move m at least one particular direction (e.g., to make at least a portion of a particular turn, around one or more components (e.g., component 33) on circuit board 30). Routing component assembly 40 may include any suitable features or components for directing cable 20. In some embodiments, routing assembly 40 may include a base plate 42 that may be secured to circuit board 30 (e.g., to top surface 31 of circuit board 30). Base plate 42 may have a small height H1 (e.g., a top surface 41 of base plate 42 may be only a small height H1 above top surface 31 of circuit board 30), such that cable 20 can be routed over top surface 41 of base plate 42 without adversely affecting the overall Z-height requirements of the assembly of circuit board 30 within electronic device 10.

To prevent cable 20 from being lifted away from circuit board 30 and away from top surface 41 of base plate 42, routing component assembly 40 may include an overhang 44 that may be positioned at least partially above base plate 42 by a distance D1). A passageway 43 may be formed between overhang 44 and base plate 42, such that cable 20 may pass through passageway 43 and may be threaded between base plate 42 and overhang 44. Overhang 44 can be coupled to base plate 42 using any suitable approach. In some embodiments, routing component assembly 40 may include a single sidewall 45 that may maintain the position of overhang 44 above base plate 42 (e.g., such that passageway 43 may have one open side or such that passageway 43 may have a "C-shaped" cross-section). Alternatively, routing component assembly 40 can include opposing sidewalls (e.g., sidewall 45 and sidewall 47), each of which may couple base plate 42 to overhang 44 (e.g., such that passageway 43 may form a closed tunnel or loop or such that passageway 43 may have an "O-shaped" cross-section).

In some embodiments, cable 20 may be routed within device 10 such that cable 20 may include a turn or a bend. Routing component assembly 40 may include one or more different features to control the position and radius of a bend of cable 20. For example, routing component assembly 40 can include a tongue 48 that may form a wall that may be perpendicular to or otherwise non-parallel with top surface 41 of base plate 42 and/or top surface 31 of circuit board 30. Tongue 48 can have any suitable length and shape including, for example, a length determined from a desired bend in cable 20. In some embodiments, tongue 48 can form a cantilever spring arm or any other suitable element that may deflect (e.g., in the direction of arrow S), such that when cable 20 contacts tongue 18, various spring characteristics of a spring arm of tongue 48 can at least partially define a bend of cable 20. Tongue 48 can be positioned in any suitable manner relative to other portions of routing component assembly 40. For example, tongue 48 can include a standalone element extending from base plate 42. Alternatively, tongue 48 can include an extension of sidewall 45 that may provide support and structure for overhang 44 (e.g., an extension of a portion of routing component assembly 40 that may define a portion of passageway 43 between overhang 44 and base plate 42).

Figure 5:
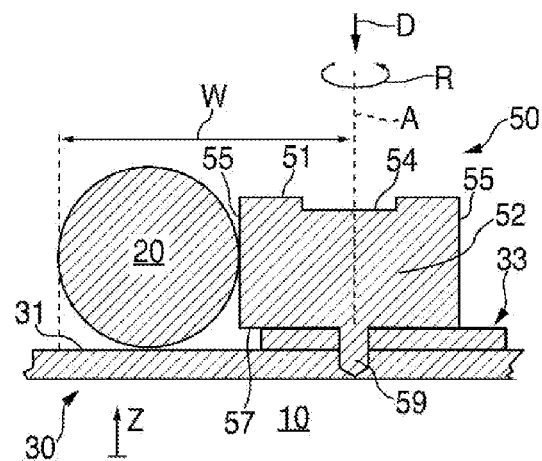
FIG. 5 is a cross-sectional view of a portion of the electronic device of FIGS. 1-4, taken from line V-V of FIG. 3.

In addition to routing component assembly 40, one or more other components of device 10 can be used route cable 20. For example, electronic device 10 can include a second routing component assembly 50 that may provide at least one point against and/or around which cable 20 may be routed. Routine component assembly 50 can include, for example, a standoff, nail, screw, or other adhesive feature that may be used to secure component 33 of device 10 to circuit board 30, or that may be used to secure circuit board 30 to another portion of electronic device 10 (e.g., to a wall of housing 18 of device 10 for securing the position of circuit board 30 within device 10). As shown in FIGS. 3 and 5, routing component assembly 50 may include a body portion 52 and a securing portion 59 coupled to both portion 52. A top surface 51 of body portion 52 may include an interface 54 that may be used to force securing portion 59 to be coupled to circuit board 30 or any other portion of device 10. For example, routing component assembly 50 may be a screw, and interface 54 may be configured to receive a screw driver for rotating routing component assembly 50 in the direction of arrow R about axis A, which may allow one or more screw threads of securing portion 59 to screw into and through top surface 31 of circuit board 30. As another example, routing component assembly 50 may be a nail, and interlace 54 may be configured to receive a hammer for driving routing component assembly 50 in the direction of arrow D along axis A, which may allow one or more nail point features of seeming portion 59 to drive into and through top surface 31 of circuit board 30. As another example, securing portion may be in adhesive that can be pressed in the direction of arrow D alone axis A, which may allow one or more adhesive features of securing portion 59 to stick to or otherwise adhere to top surface 31 of circuit board 30.

Routing component assembly 50 may also include a bottom surface 57 of body portion 52 that may lay flush against or at least lace top surface 31 of circuit board 30 once securing portion 59 has been provided into and through top surface 31 of circuit board 30. In some embodiments, as shown in FIGS. 3 and 5, a component of device 10, such as component 33 may be positioned between bottom surface 57 and circuit board 30, such that once routing component assembly 50 has been secured to circuit board 30, component 33 may be secured therebetween. For example, as shown in FIG. 5, securing portion 59 may extend from body portion 52, through a portion of component 33 (e.g., through a hole in a portion of component 33), and into and through top surface 31 of circuit board 30, such that component 33 may be held between bottom surface 57 of body portion 52 and top surface 31 of circuit board 30. In other embodiments, securing portion 59 may extend from body portion 52, and adjacent to an edge of component 33 (e.g., rather than through a hole provided through a portion of component 33), and into and through top surface 31 of circuit board 30, such that a portion of component 33 extending away from that edge may be held between bottom surface 57 of body portion 52 and top surface 31 of circuit board 30. Therefore, routing component assembly 50 may have a primary purpose other than routing cable 20. However, one or more portions of routing component assembly 50 may be configured to route cable 20 in one or more ways. For example, as shown, at least one side portion 55 of routing component assembly 50, which may extend between top surface 51 and bottom surface 57 of body portion 52. The geometry and position of side portion 55 of routing component assembly 50 within device 10 may be configured to route cable 20. As shown, in FIG. 3, side portion 55 may form a circular cross-section of routing component assembly 50, and a curved portion of side portion 55 (e.g., about axis A) may route cable 20 about routing component assembly 50, and, for example, about component 33, when a portion of cable 20 contacts side portion 55.

Figure 5A:
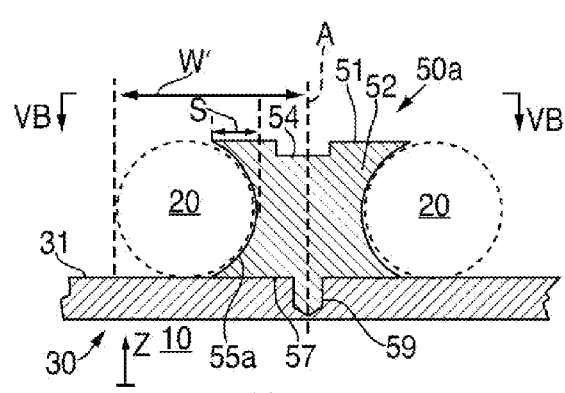
FIG. 5A is a cross-sectional view, similar to FIG. 5, of an alternative embodiment of the invention.
Figure 5B:
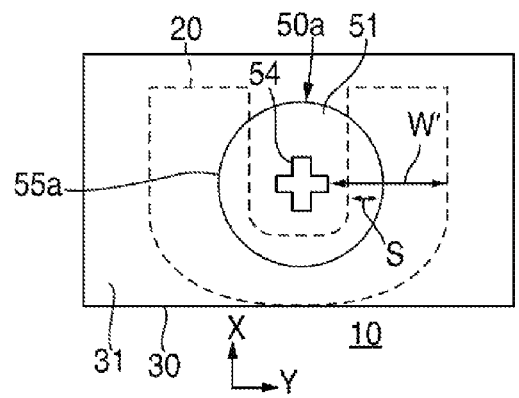
FIG. 5B is an elevational view of the portion of the electronic device of FIG. 5A, taken from line VB-VB of FIG. 5A.

Although body portion 52 of routing component assembly 50 of FIGS. 3 and 5 ma be shown as having a generally cylindrical shape, such that side portion 55 may be straight between top surface 51 and bottom surface 57 (e.g., such that side portion 55 may be generally perpendicular to top surface 31 of circuit board 30), body portion 52 may be configured to have any other suitable shape for interacting with and routing one or more cables in one or more various ways. For example, in another embodiment, as shown in FIGS. 5A and 5B, a routing component assembly 50a, which may be substantially similar to routing component assembly 50, may instead include a side portion 55a that may be at least partially curved between top surface 51 and bottom surface 57 (e.g., such that different positions along side portion 55 may form different angles with respect to top surface 31 of circuit board 30). Side portion 55a may be at least partially curved between top surface 51 and bottom surface 57 (e.g., concavely or inwardly towards axis A) to match at least a portion of a curved external surface of cable 20. This may allow routing component assembly 50a to more easily maintain its physical relationship with cable 20. For example, side portion 55a may be at least partially curved between top surface 51 and bottom surface 57, such that side portion 55a may at least partially restrict the movement of cable 20 in the Z-direction.

Figure 5C:
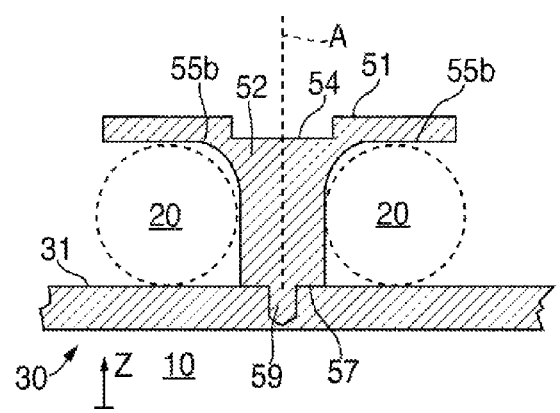
FIG. 5C is a cross-sectional view, similar to FIGS. 5 and 5A, of another alternative embodiment of the invention.

Moreover, when side portion 55a may be at least partially curved between top surface 51 and bottom surface 57 to match at least a portion of the external surface of cable 20, the surface area of top surface 31 of circuit board 30 (e.g., in an X-Y plane) that may be required by the interaction of cable 20 and routing component assembly 50a may be reduced. For example, unlike routing component assembly 50, which may require a width W between axis A and a far edge of cable 20, routing component assembly 50a may require a reduced width W, which may be less than width W by a distance S. Distance S may be the thickness of the portion of cable 20 that may nest between top surface 51 and bottom surface 57 when cable 20 is routed by routing component assembly 50a.

in another embodiment, as shown in FIG. 5C, a routing component assembly 50b may include a side portion 55b that may be shaped to interact with and route cable 20 without positioning a portion of cable 20 between top surface 51 and bottom surface 57. Instead, side portion 55b may be shaped such that cable 20 may rest against side portion 55b and below top surface 51, while also resting directly against top surface 31 of circuit board 30. Therefore, bottom surface 57 of body portion 52 of routing component assembly 50b may be smaller than top surface 51. However, because top surface 51 may extend over at least a portion of cable 20 when cable 20 interfaces with body portion 52, routing component assembly 50b may be configured to limit the movement of cable 20 in the Z-direction.

Figure 5D:
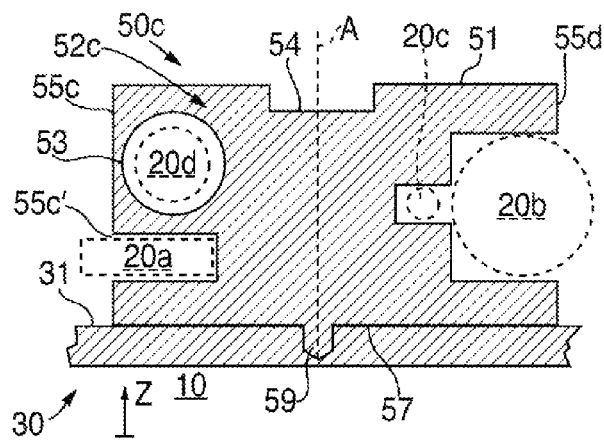
FIG. 5D is a cross-sectional view, similar to FIGS. 5, 5A, and 5C, of yet another alternative embodiment of the invention.

In yet another embodiment, as shown in FIG. 5D, a routing component assembly 50c may include a side portion 55c that may not be symmetrical about axis A. Instead, a first portion 55c' of side portion 55c (e.g., to the left side of axis A in FIG. 5D) may be shaped to receive at least a portion of a first cable 20a between a first portion of top surface 51 and a first portion of bottom surface 57, while a second portion 55c" of side portion 55c (e.g., to the right side of axis A in FIG. 5D) may be shaped to receive at least a portion of a second cable 20b between a second portion of top surface 51 and a second portion of bottom surface 57. In some embodiments, routing component assembly 50c may be configured to receive more than one cable between an edge of body portion 52 and axis A. For example, as shown, second portion 55c" of side portion 55c may also be shaped to receive a third cable 20c between second cable 20b and axis A. Moreover, in some embodiments, routing component assembly 50c may be configured to receive more than one cable between top surface 51 and bottom surface 57. For example, as shown, body portion 52c of FIG. 5D may be configured to include a passageway 53 therethrough, which may be shaped to receive a fourth cable 20d that may be threaded through passageway 53.

Figure 6:
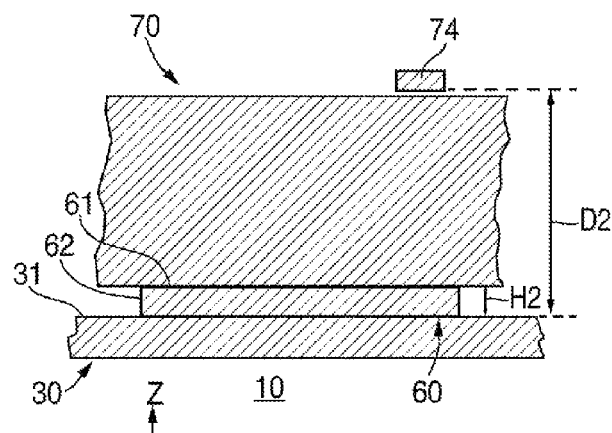
FIG. 6 is a cross-sectional view of a portion of the electronic device of FIGS. 1-5, taken from line VI-VI of FIG. 3, in accordance with some embodiments of the invention.
Figure 7:
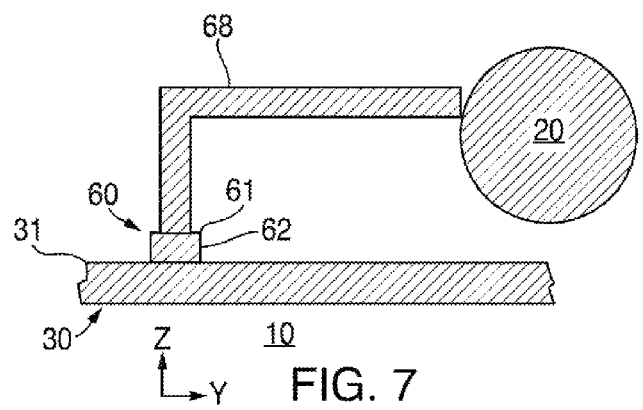
FIG. 7 is a cross-sectional view of a portion of the electronic device of FIGS. 1-6A, taken from line VII-VII of FIG. 3, in accordance with some embodiments of the invention.

As shown in FIGS. 3 and 6-7, device 10 may include a third routing component assembly 60 for guiding cable 20 in at least one direction. Third routing component assembly 60 may be coupled to top surface 31 of circuit board 30 and may be positioned such that cable 20 may be forced or directed by component assembly 60 to move in at least one particular direction (e.g., to extend along the side of one or more components (e.g., component 35) on circuit board 30). Routing component assembly 60 may include any suitable features or components for directing cable 20. In some embodiments, routing assembly 60 may include a base plate 62 that may be secured to circuit board 30 (e.g., to top surface 31 of circuit board 30). Base plate 62 may have a small height H2 (e.g., a top surface 61 of base plate 62 may be only a small height H2 above top surface 31 of circuit board 30), such that cable 20 can be routed over top surface 61 of base plate 62 without adversely affecting the overall Z-height requirements of the assembly of circuit board 30 within electronic device 10.

In some embodiments, third routing component assembly 60 may include a tongue 68 that may form a wall that may be perpendicular to or otherwise non-parallel with top surface 61 of base plate 62 and/or top surface 31 of circuit board 30. Tongue 68 can have any suitable length and shape including, for example, a length determined from a desired bend in cable 20. In some embodiments, tongue 68 can form a cantilever spring arm or any other suitable element that may deflect (e.g., in the direction of arrow S1), such that when cable 20 contacts tongue 68, various spring characteristics of a spring arm of tongue 68 can at least partially define or prevent a bend of cable 20. Tongue 68 can be positioned in any suitable manner relative to other portions of routing component assembly 60. For example, tongue 68 can include a standalone element extending from base plate 62.

Figure 6A:
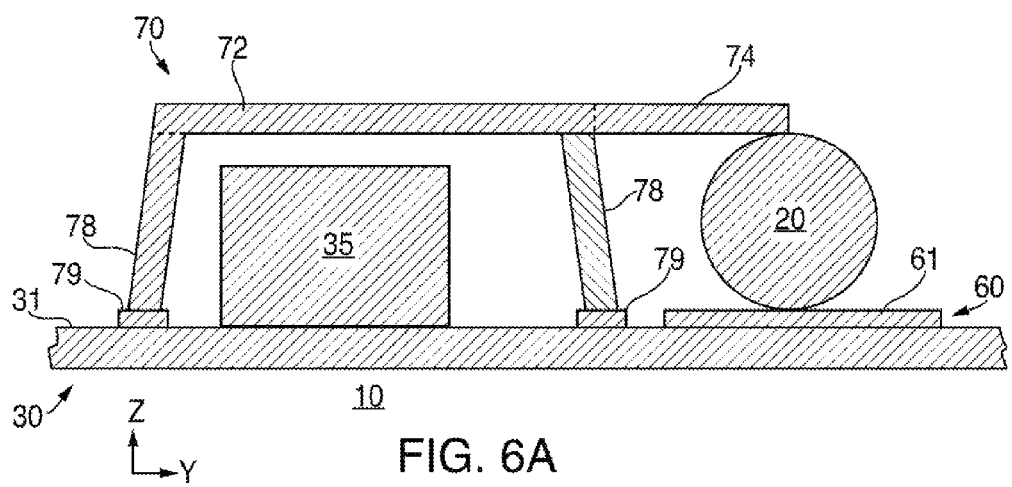
FIG. 6A is a cross-sectional view of a portion of the electronic device of FIGS. 1-6, taken from line VIA-VIA of FIG. 3, in accordance with some embodiments of the invention.

In some embodiments, rather than second routing component assembly 60 providing an overhang (e.g., similarly to first routing component assembly 40 providing both base plate 42 and overhang 44), device 10 may include a fourth routing component assembly 70 that may provide an overhang 74. Fourth routine component assembly 70 may be positioned with respect to third routing component assembly 60 such that overhang 74 of fourth routing component assembly 70 may be positioned at least partially above base plate 62 of third routing component assembly 60 (e.g., by a distance D2), and such that overhang 74 may prevent cable 20 from being lifted away from circuit board 30 and away from top surf 61 of base plate 62 (e.g., in the Z-direction). As shown in FIGS. 3, 6, and 6A, fourth routing component assembly 70 may be distinct from third routing component assembly 60 (e.g., such that no portion of component assembly 60 may contact any portion of component assembly 70). In some embodiments (not shown), third routing component assembly 60 may include one or more sidewalls, which may be similar to one or more of sidewalls 45 and 47 of routing component assembly 40, such that the one or more sidewalls and base plate 62 of routing component assembly 60, together with overhang 74 of routing component assembly 70, may form a passageway that may he substantially "C-shaped" or "O-shaped", even if overhang 74 may be distinct from and/or may not contact any portion of routing component assembly 60. Therefore, in some embodiments, overhang 74 of routing component assembly 70 may be coupled to a portion of routing component assembly 60 (e.g., a sidewall may extend between and couple base plate 62 and overhang 74, which may form at least a portion of a passageway for guiding cable 20). In some other embodiments routing component assembly 60 may not include base plate 62, but may still include one or more sidewalls extending, upwardly from circuit board 30 for forming at least a portion of a passageway with overhang 74 of routing component assembly 70. In yet other embodiments, overhand 74 may be provided as an overhang to routing component assembly 40 (e.g., similarly to overhang 44 of FIGS. 3 and 4) and/or may be provided as an overhang to routing component assembly 90 (e.g., similarly to overhang 94 of FIGS. 3 and 12).

In some embodiments, as shown in FIGS. 3 and 6A, a component of device 10, such as component 35 may be positioned under at least a portion of fourth routing component assembly 70. For example, fourth routing component assembly 70 may provide at least a portion of a shield assembly that may be configured to reduce the amount of electromagnetic interference ("EMI"), radio frequency interference ("RFI"), and/or any other type of unwanted disturbance that may interrupt, obstruct or otherwise affect or limit the effective performance of component 35 due to electromagnetic conduction or electromagnetic radiation from an external source. Fourth routing component assembly 70 may be a shield that can include a shield body 72 and one or more shield fingers 78 extending downwardly from shield body 72 (see, e.g., co-pending, commonly-assigned, U.S. patent application Ser. No 13/222,179, filed Aug. 31, 2011, which is hereby incorporated by reference herein in its entirety). At least some of shield fingers 78 may be electrically coupled to circuit board 30 (e.g., via solder 79 or any other suitable electrical connection technique). Shield fingers 78 may be coupled to a ground plane of circuit board 30 for providing ground points about assembly 70 for protecting component 35, which may be positioned under shield body 72 and surrounded by shield fingers 78. Overhang 74 may extend away from shield body 74 and or from one or more shield fingers 78. Therefore, routine component assembly 70 may have a primary purpose other than routing cable 20. However, one or more portions of routing component assembly 70 (e.g., overhang 74) may be configured to route cable 20 in one or more ways.

As shown in FIGS. 3 and 8-10, device 10 may include a fifth routing component assembly 80 for guiding cable 20 in at least one direction. Fifth routing component assembly 80 may be coupled to top surface 31 of circuit board 30 and may be positioned such that cable 20 may be forced or directed by component assembly 80 to move in at least one particular direction (e.g., to extend along the side of one or more components (e.g., component 37) and/or about one or more components (e.g., component 39) on circuit board 30). Routing component assembly 70 may include any suitable features or components for directing cable 20. In some embodiments, routing assembly 70 may be substantially similar to routing assembly 60. For example, as shown in FIGS. 3 and 8-10, a component of device 10, such as component 37 may be positioned under at least a portion of fifth routing component assembly 80 and fifth routing component assembly 80 may provide at least a portion of a shield assembly that may be configured to reduce the amount of unwanted disturbance that may interrupt, obstruct, or otherwise affect or limit the effective performance of component 37.

Figure 8:
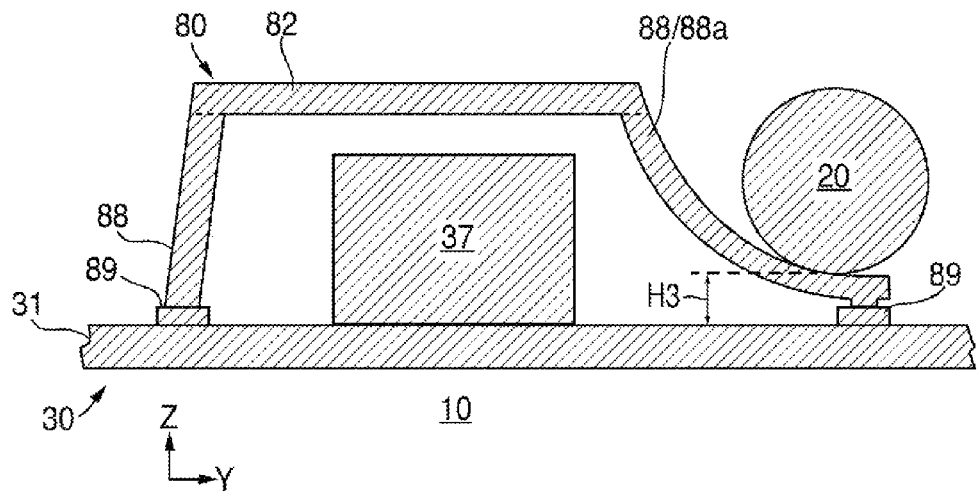
FIG. 8 is a cross-sectional view of a portion of the electronic device of FIGS. 1-7, taken from line VIII-VIII of FIG. 3, in accordance with some embodiments of the invention.
Figure 9:
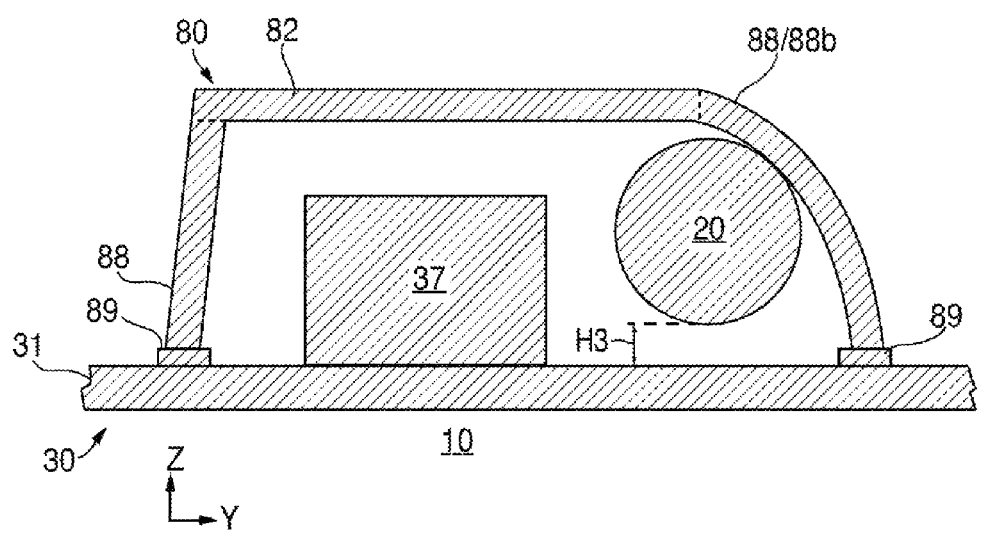
FIG. 9 is a cross-sectional view of a portion of the electronic device of FIGS. 1-8, taken from line IX-IX of FIG. 3, in accordance with some embodiments of the invention.

Fifth muting component assembly 80 in be a shield that Carl include a shield body 82 and one or more shield fingers 88 extending downwardly from shield body 82. At least some of shield fingers 88 may be electrically coupled to shield body 82, and or at least some of shield fingers 88 may be electrically coupled to circuit board 30 (e.g., via solder 89 or any other suitable electrical connection technique). Shield fingers 88 may be coupled to a ground plane of circuit board 30 for providing ground points about assembly 80 for protecting component 37, which may be positioned under shield body 82 and surrounded by shield fingers 88. As shown in FIGS. 3 and 8, for example, a first shield finger 88a may be configured to extend underneath a portion of cable 20, such that at least a portion of first shield finger 88a may be positioned between top surface 31 of circuit board 30 and cable 20 for supporting cable 20 above circuit board 30. Alternatively or additionally, as shown in FIGS. 3 and 9, for example, a second shield finger 88b may be configured to extend above a portion of cable 20, such that cable 20 may be positioned between at least a portion of second shield finger 88b and top surface 31 of circuit board 30, and such that second shield finger 88b may limit the amount by which cable 20 may lift above circuit board 30 in the Z-direction.

In some embodiments, as shown in FIG. 3, second shield finger 88b may be positioned between two adjacent shield fingers 88 that may be configured to extend underneath cable 20, and a shield, finger 88 that may be configured to extend underneath cable 20 may be positioned between two adjacent shield fingers 88 that may be configured to extend above cable 20. That is, any two fingers 88 configured like finger 88a with respect to cable 20 may be separated by a finger 88 configured like finger 88b with respect to cable 20, such that cable 20 may be maintained, by fingers 88 at a suitable distance above top surface 31 of circuit board 30 (e.g., distance H3 of FIGS. 7 and 8). Therefore, fifth routing component assembly 80 may have a primary purpose other than routing cable 20. However, one or more portions of routing component assembly 80 (e.g., fingers 88a and 88b) may be configured to route cable 20 in one or more ways.

Figure 10:
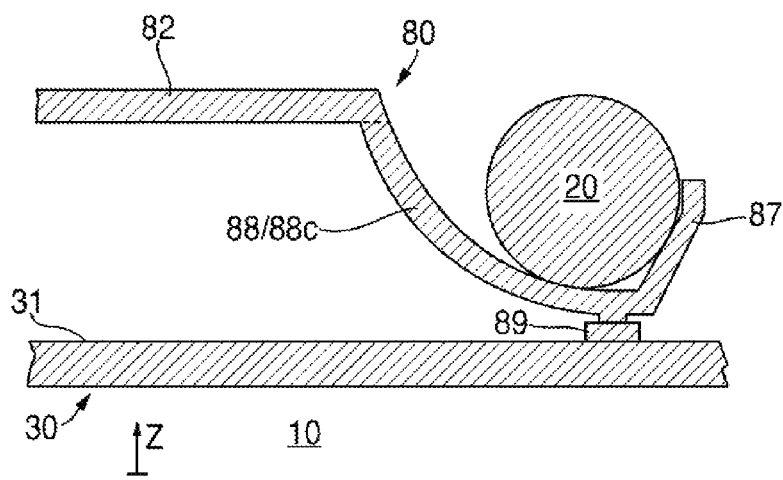
FIG. 10 is a cross-sectional view of a portion of the electronic device of FIGS. 1-9, taken from line X-X of FIG. 3, in accordance with some embodiments of the invention.
Figure 11:
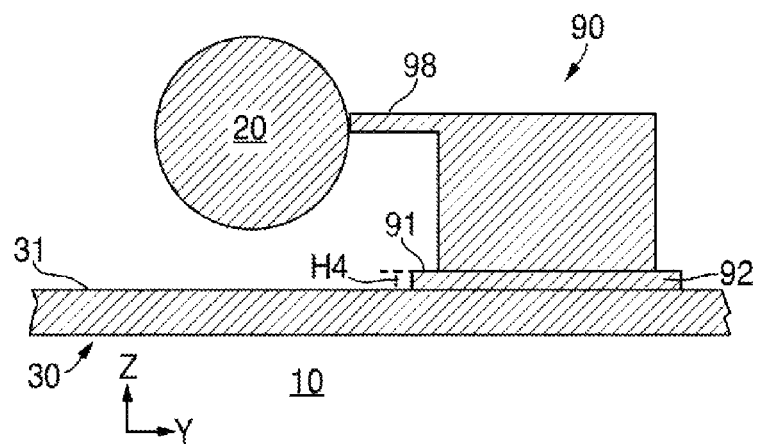
FIG. 11 is a cross-sectional view of a portion of the electronic device of FIGS. 1-10, taken from line XI-XI of FIG. 3, in accordance with some embodiments of the invention.
Figure 12:
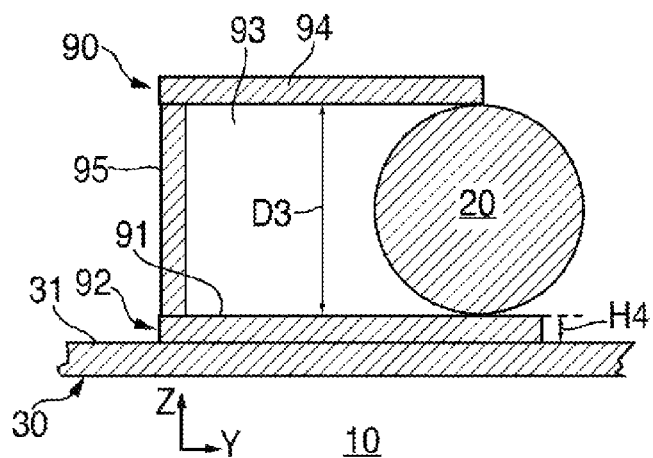
FIG. 12 is a cross-sectional view of a portion of the electronic device of FIGS. 1-11, taken from line XII-XII of FIG. 3, in accordance with some embodiments of the invention.

As shown in FIGS. 3 and 10, fifth routing component assembly 80 may include a third shield finger 88c, which may be configured to extend underneath a portion of cable 20, such that at least a portion of third shield finger 88c may be positioned between top surface 31 of circuit board 30 and cable 20 for supporting cable 20 above circuit board 30. However, unlike first shield finger 88a, third shield finger 88c may also include a tongue 87 that may form a wall that may be perpendicular to or otherwise non-parallel with solder 89 and/or top surface 31 of circuit board 30. Tongue 87 can have any suitable length and shape including, for example, a length determined from a desired bend in cable 20 (e.g., at least a portion of a desired bend about component 39). In some embodiments, tongue 87 can form a cantilever spring arm or any other suitable element that may deflect (e.g., in the direction of arrow S2), such that when cable 20 contacts tongue 87, various spring characteristics of a spring arm of tongue 87 can at least partially define or prevent a bend of cable 20. Tongue 87 can be positioned in any suitable manner relative to other portions of routing component assembly 80. For example, tongue 87 can extend from third shield finger 88c. In other embodiments, tongue 87 can include a standalone element that may extend front solder 89.

As shown in FIGS. 3 and 11-13, device 10 may include a sixth routing component assembly 90 for guiding cable 20 in at least one direction. Sixth routing component assembly 90 may be coupled to top surface 31 of circuit board 30 and may be positioned such that cable 20 may be forced or directed by component assembly 90 to move in at least one particular direction (e.g., to make at least a portion of a particular turn around one or more components (e.g., component 39) on circuit board 30). Routing component assembly 90 may include any suitable features or components for directing cable 20. In some embodiments, routing assembly 90 may include a base plate 92 that may be secured to circuit board 30 (e.g., to top surface 31 of circuit board 30). Base plate 92 may have a small height H4 (e.g., a top surface 91 of base plate 92 may be only a small height H4 above top surface 31 of circuit board 30), such that cable 20 can be routed over top surface 91 of base plate 92 without adversely affecting the overall Z-height requirements of the assembly of circuit board 30 within electronic device 10.

To prevent cable 20 from being lifted away from circuit board 30 and away from top surface 91 of base plate 92, routing component assembly 90 may include an overhang 94 that may be positioned at least partially above base plate 92 (e.g., by a distance D3). A passageway 93 may be formed between overhang 94 and base plate 92, such that cable 20 may pass through passageway 93 and may be threaded between base plate 92 and overhang 94. Overhang 94 can be coupled to base plate 92 using any suitable approach. In some embodiments, routing component assembly 90 may include a single sidewall 95 that may maintain the position of overhang 94 above base plate 92 (e.g., such that passageway 93 may have one open side or such that passageway 93 may have a "C-shaped" cross-section). Alternatively, routing component assembly 90 can include opposing sidewalls, each of which may couple base plate 92 to overhang 94 (e.g., such that passageway 93 may form a closed tunnel or loop or such that passageway 93 ma have an "O-shaped" cross-section).

In some embodiments, cable 20 may be routed within device 10 such that cable 20 may include a turn or a bend. Routing component assembly 90 may include one or more different features to control the position and radius of a bend of cable 20. For example, routing component assembly 90 can include a tongue 98 that may form a wall that may be perpendicular to or otherwise non-parallel with top surface 91 of base plate 92 and/or top surface 31 of circuit hoard 30. Tongue 98 can have any suitable length and shape including, for example, a length determined from a desired bend in cable 20. In some embodiments, tongue 98 can form a cantilever spring arm or any other suitable element that may deflect (e.g., in the direction of arrow 53), such that when cable 20 contacts tongue 98, various spring characteristics of a spring arm of tongue 98 can at least partially define a bend of cable 20 (e.g., a bend about component 39). Tongue 98 can be positioned in any suitable manner relative to other portions of routing component assembly 90. For example, tongue 98 can include a standalone element extending from base plate 92. Alternatively, tongue 98 can include an extension of a sidewall of assembly 90.

Figure 13:
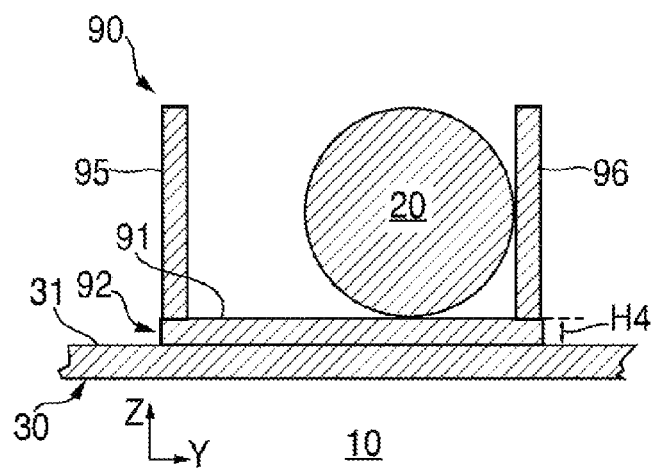
FIG. 13 is a cross-sectional view of a portion of the electronic device of FIGS. 1-12, taken from line XIII-XIII of FIG. 3, in accordance with some embodiments of the invention.

In some embodiments, assembly 900 may include a second sidewall 96 extending from base plate 92, which may help guide cable 20, but which may not form a portion of passageway 93. For example, as shown in FIGS. 3 and 13, sidewall 96 may help guide cable 20 around component 39 and towards component 38. Sidewall 96 may face sidewall 95 along at least a portion of base plate 92 (e.g., for constraining the movement of cable in the Y-direction).

Figure 14:
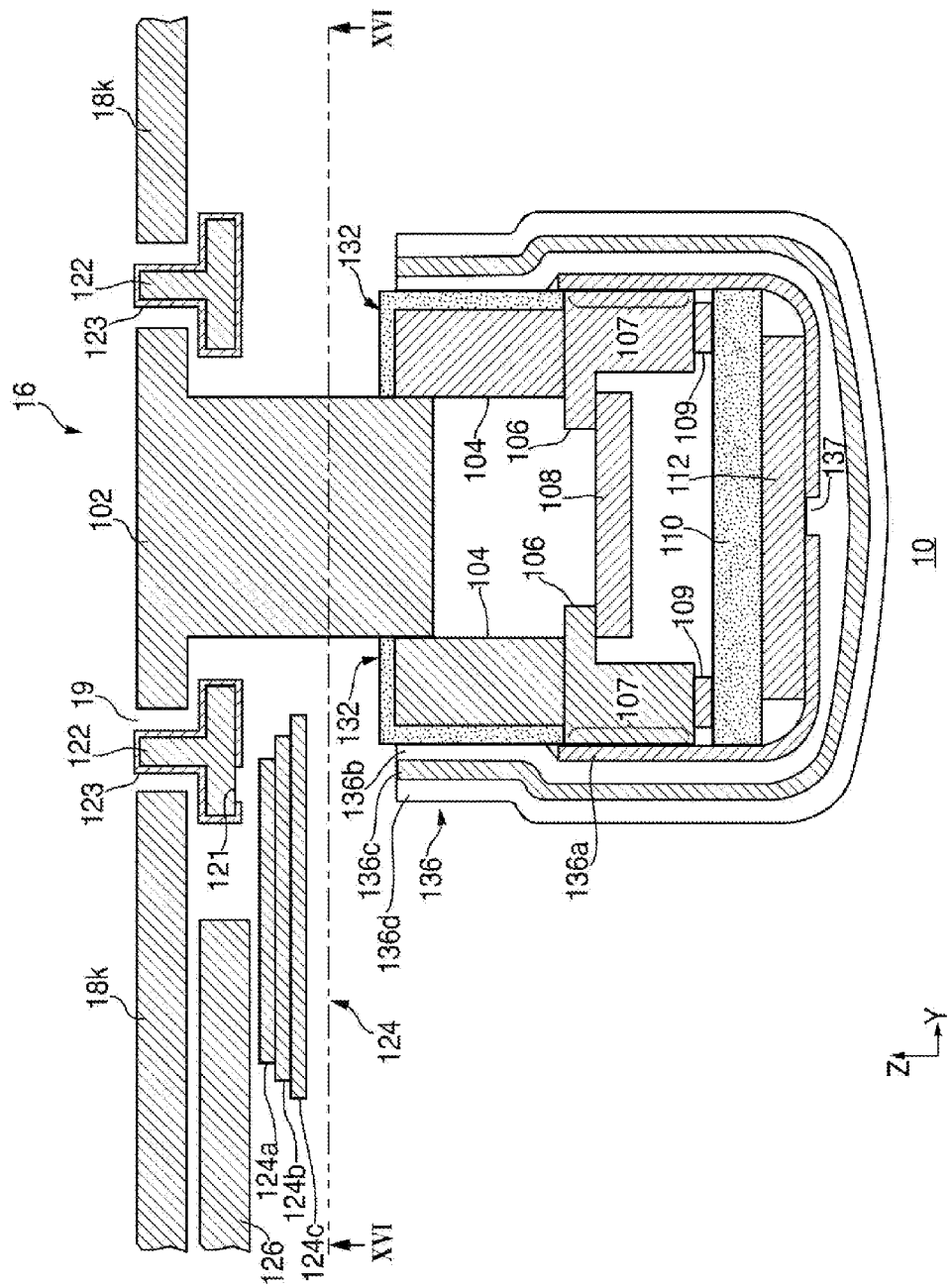
FIG. 14 is a cross-sectional view of a portion of the electronic device of FIGS. 1-13, taken from line XIV-XIV of FIG. 2.
Figure 15:
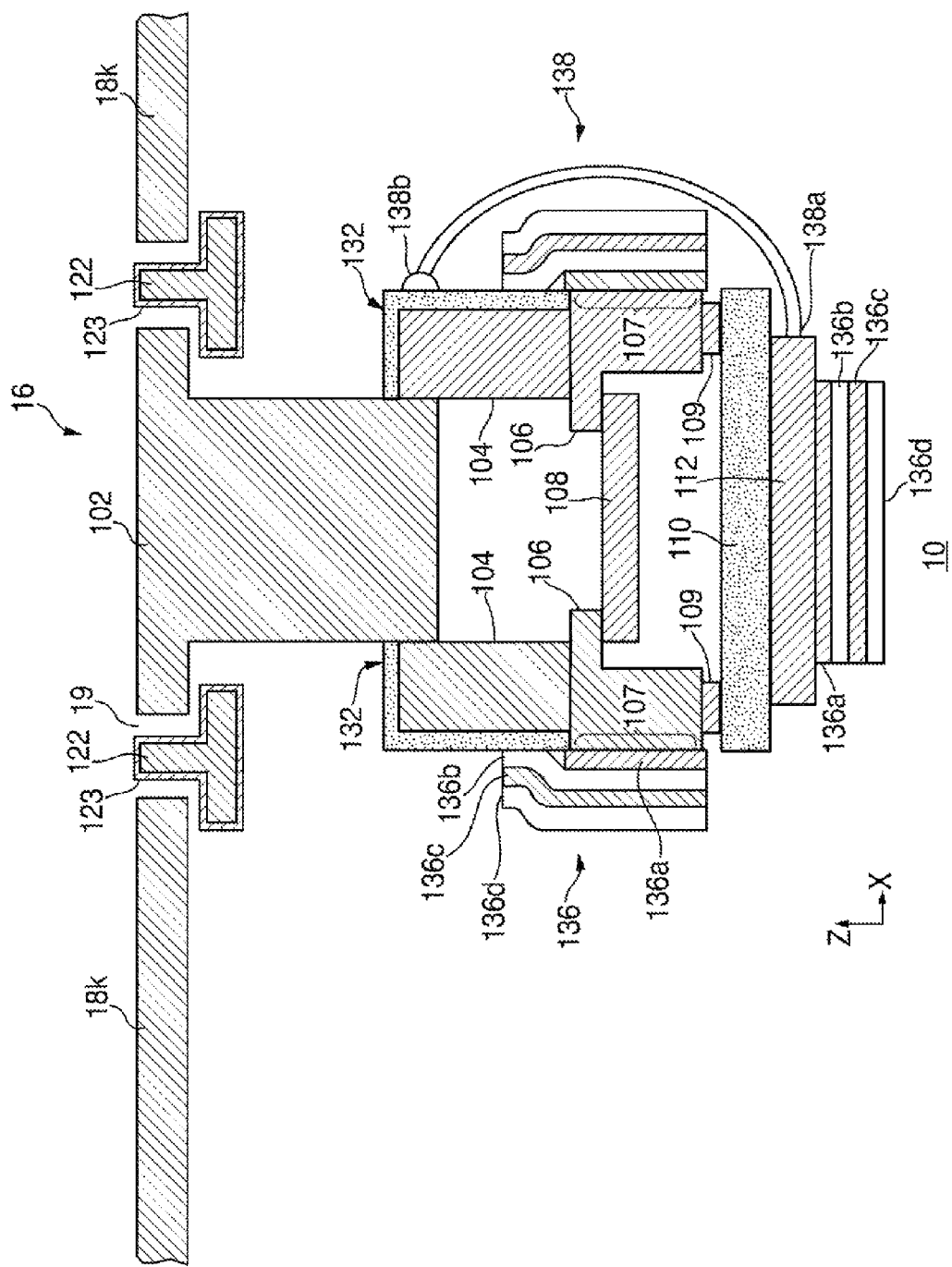
FIG. 15 is a cross-sectional view of a portion of the electronic device of FIGS. 1-14, taken from line XV-XV of FIGS. 2.
Figure 16:
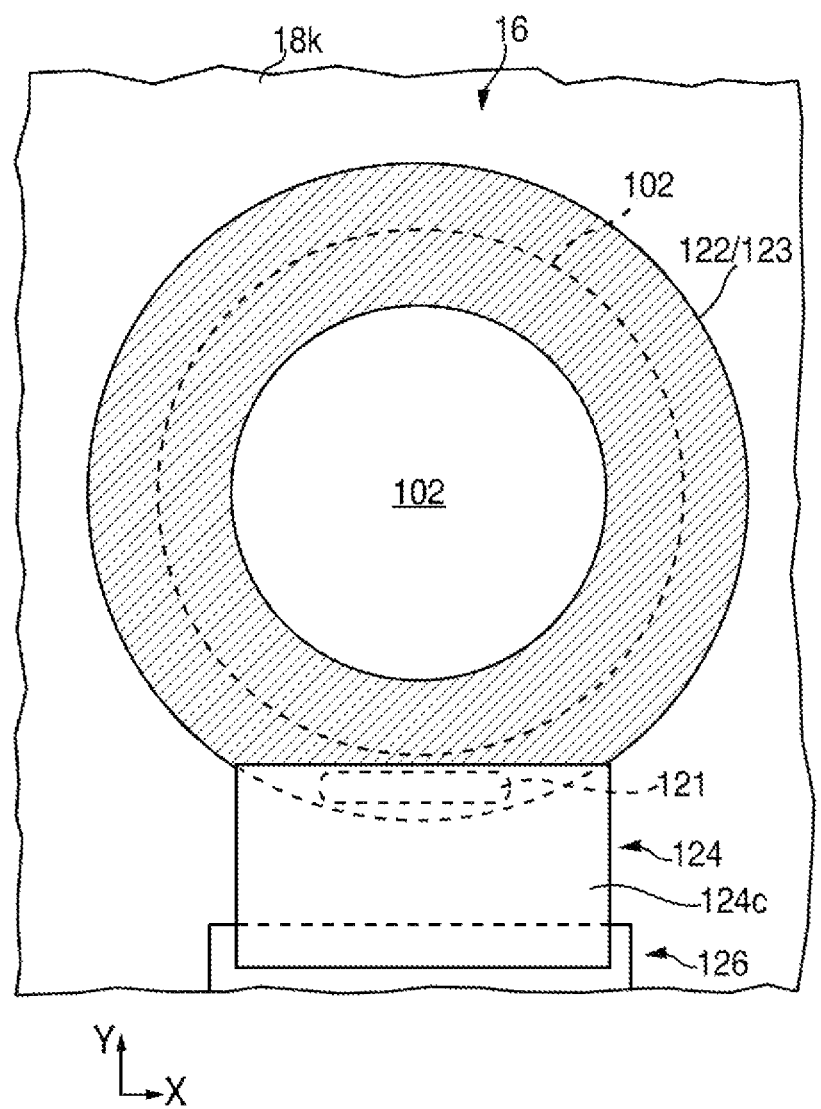
FIG. 16 is an elevational view of a portion of the electronic device of FIGS. 1-15, taken from line XVI-XVI of FIG. 14.

In some embodiments, as shown in FIGS. 14-16, for example, electronic device 10 may include a system for grounding an electrically isolated trim about camera component assembly 16. As shown, camera component assembly 16 may include a lens component 102, a motor 104 that may control lens component 102, a substrate 106 that may support motor 104, an image sensor 108 that may be coupled to substrate 106, a flexible circuit 110 that may be coupled to substrate 106 (e.g., via solder 109), and a stiffener 112 that may support flexible circuit 110 and/or substrate 106. A portion of camera component assembly 16 (e.g., a portion of lens component 102) may be positioned within and/or exposed through an opening 19 that may be provided through back wall 18k of housing 18 of device 10. Opening 19 may allow light from the environment external to housing 18 to be captured by camera component assembly 16. Device 10 may also include a camera trim 122 that may be positioned within opening 19 and about the exposed portion of camera assembly 16 (e.g., about an end portion of lens component 102). Trim 122 may retain and provide support to the exposed portion of camera component assembly 16 within opening 19. Trim 122 may be any suitable material, including, but not limited to metal (e.g., stainless steel). In some embodiments, trim 122 may be coated with a surface coating 123 to cosmetically match or compliment housing 18 (e.g., via physical vapor deposition). When trim 122 is provided as an electrically conductive component, such as metal, coating 123 may be non-conductive to protect trim 122 from other components of device 10. In some embodiments, trim 122 may be provided about any suitable portion of any suitable component or component assembly of device 10 (e.g., any device component or device component assembly that may be at least partially exposed through an opening in a wall of housing 18).

However, when trim 122 is provided as an electrically conductive component, trim 122 may be electrically isolated from all other components of device 10. Therefore, in some embodiments, device 10 may be configured to around trim 122. For example, as shown in FIGS. 14-16, device 10 may be provided with an electrically conductive bridge 124 that may electrically couple trim 122 to another component of device 10 that is electrically coupled to around (e.g., to reinforcement plate 126). Reinforcement plate 126 may be any suitable component of device 10 that may be electrically coupled to ground. For example, reinforcement plate 126 may be stainless steel or nickel metal plate that may reinforce at least a portion of housing 18 or any other component of device 10. Moreover, reinforcement plate 126 may be electrically coupled to a grounded element of device 10. Electrically conductive bridge 124 may be any suitable component that can electrically couple grounded reinforcement plate 126 to an electrically conductive portion of trim 122. For example, a portion of coating 123 may be removed from trim 122 (e.g., through laser ablation or any other suitable process) to expose a conductive portion 121 of trim 122. That exposed portion 121 of trim 122 may be electrically coupled to grounded plate 126 via conductive bridge 124.

In some embodiments, conductive bridge 124 may be an electrostatic discharge ("ESD") conductive adhesive or Kapton™ tape. For example, bridge 124 may be a multi-layer laminate that can include a copper or other suitable conductive layer 124a, a conductive adhesive layer 124b, and a cosmetic layer 124c. Conductive layer 124a may be electrically coupled to exposed portion 121 of trim 122 and a conductive portion of grounded plate 126. Adhesive layer 124b may extend over at least a portion of conductive layer 124a to adhere conductive layer 124a to both trim 122 and plate 126. In sonic embodiments, layers 124a and 124b may be a single layer. Cosmetic layer 124c may be provided over at least a portion of conductive layer 124a and/or over at least a portion of adhesive layer 124b to provide a cosmetic decoration to conductive bridge 124. For example, cosmetic layer 124c may match, at least in color or reflectivity, a portion of trim 122, a portion of coating 123, a portion of plate 126, and/or any other portion of device 10 that may be visible when looking at the inside of device 10 (e.g., the view shown in FIG. 16). In some embodiments, cosmetic layer 124c may cover the entirety of layers 124a and/or 124b so that only cosmetic layer 124c may provide the cosmetics of conductive bridge 124.

In some embodiments, as shown in FIGS. 14-15, electronic device 10 may be provided with a system for shielding at least a portion of camera assembly 16. A shield 132 may he provided about at least a portion of motor 104 for shielding motor 104 from various types of disturbance (e.g., EMI and or RFI). In some embodiments, shield 132 may be sheet metal or any other suitable material that may be electrically coupled to substrate 106 (e.g., to a ground plane made available on a top surface of substrate 106). Shield 132 may extend about one or more sides of motor 104 for properly shielding motor 104 from interference.

An at least partially conductive wrap may be provided about at least a portion of camera assembly 16. For example, a wrap 136 may be provided about at least a portion of assembly 18. Substrate 106 may have one or more exposed traces on a site of substrate 106 (e.g., along one or more sides 107 of substrate 106). Therefore, in order to prevent any of those traces from being shorted, wrap 136 may include a non-conductive layer 136a that may be provided along each side 107 of substrate 106 that may have an exposed trace. Wrap 136 may also include a conductive adhesive 136b that may be provided about non-conductive layer 136a. Wrap 136 may also include a copper or other suitable conductive layer 136c that may be provided about conductive adhesive layer 136b. Wrap 136 may also include a cosmetic layer 136d that may be provided about conductive layer 136c. In Some embodiments, layers 136b and 136c may be an ESD conductive adhesive or Kapton™ tape. In some embodiments, layers 136b and 136c may be a single layer. Cosmetic layer 136d may be provided over at least a portion of layer 136a and/or over at least a portion of layer 136b and/or over at least a portion of layer 136c to provide a cosmetic decoration to camera assembly 16. For example, cosmetic layer 136d may match, at least in color or reflectivity, a portion of trim 122, a portion of plate 126, a portion of housing 18, and/or any other portion of device 10 that may be visible when looking at the inside of device 10. In some embodiments, cosmetic layer 136d may cover the entirety of layer 136a and/or the entirety of layer 136b and/or the entirety of layer 136c so that only cosmetic layer 136d may provide the cosmetics of substantially some or all of camera assembly 16.

As shown, non-conductive layer 136a may terminate at or near the intersection of motor 104 and/or shield 132 with substrate 106, such that conductive layer 136b and/or conductive layer 136c may be exposed to and contact shield 132. This may allow a conductive portion of wrap 136 to be electrically grounded by shield 132. In some embodiments, a portion of non-conductive layer 136a that may be extending along stiffener 112 may be removed. For example, as shown in FIG. 14, a portion 137 of non-conductive layer 136a may be removed such that a conductive portion of wrap 136 (e.g., layer 136b and or layer 136c) may be electrically coupled to stiffener 112 (e.g., such that stiffener 112 may be electrically grounded by a conductive portion of wrap 136 (e.g., when a conductive portion of wrap 136 is electrically grounded by shield 132)). Alternatively or additionally, as shown in FIG. 15, wrap 136 may be provided on one or more sides of camera assembly 16 (e.g., along at least a portion of shield 132 and/or substrate 106) but not underneath assembly 16 (e.g., along the bottom of stiffener 112). Therefore, in some embodiments, wrap 136 may be provided to extend from one side of assembly 16, under assembly 16, and up an opposite side of assembly 16 (e.g., as shown in FIG. 14), while in other embodiments, wrap 136 may be provided along one or more sides of assembly 16 but not under assembly 16 (e.g., as shown in FIG. 14A and/or 15).

As shown in FIG. 15, camera assembly 16 may be provided with one or more mechanisms for grounding stiffener 112. For example, an electrically conductive arm 138 may be configured to extend from stiffener 112 to shield 132. In some embodiments, a first end 138a of arm 138 may be fixed to stiffener 112 and a second end 138b of arm 138 may be biased to exert pressure against shield 132 for maintaining an electrical connection between shield 132 and arm 138. In other embodiments, second end 138b of arm 138 may be fixed to a portion of shield 132 and first end 138a of arm 138 may be biased to exert pressure against stiffener 112 for maintaining an electrical connection between stiffener 112 and arm 138. Alternatively, arm end 138a may be fixed to stiffener 112 and arm end 138b may be fixed to shield 132. Arm 138 may be configured to extend around any portion of wrap 136 that may be provided along camera assembly 16 between shield 132 and stiffener 112.

Figure 14A:
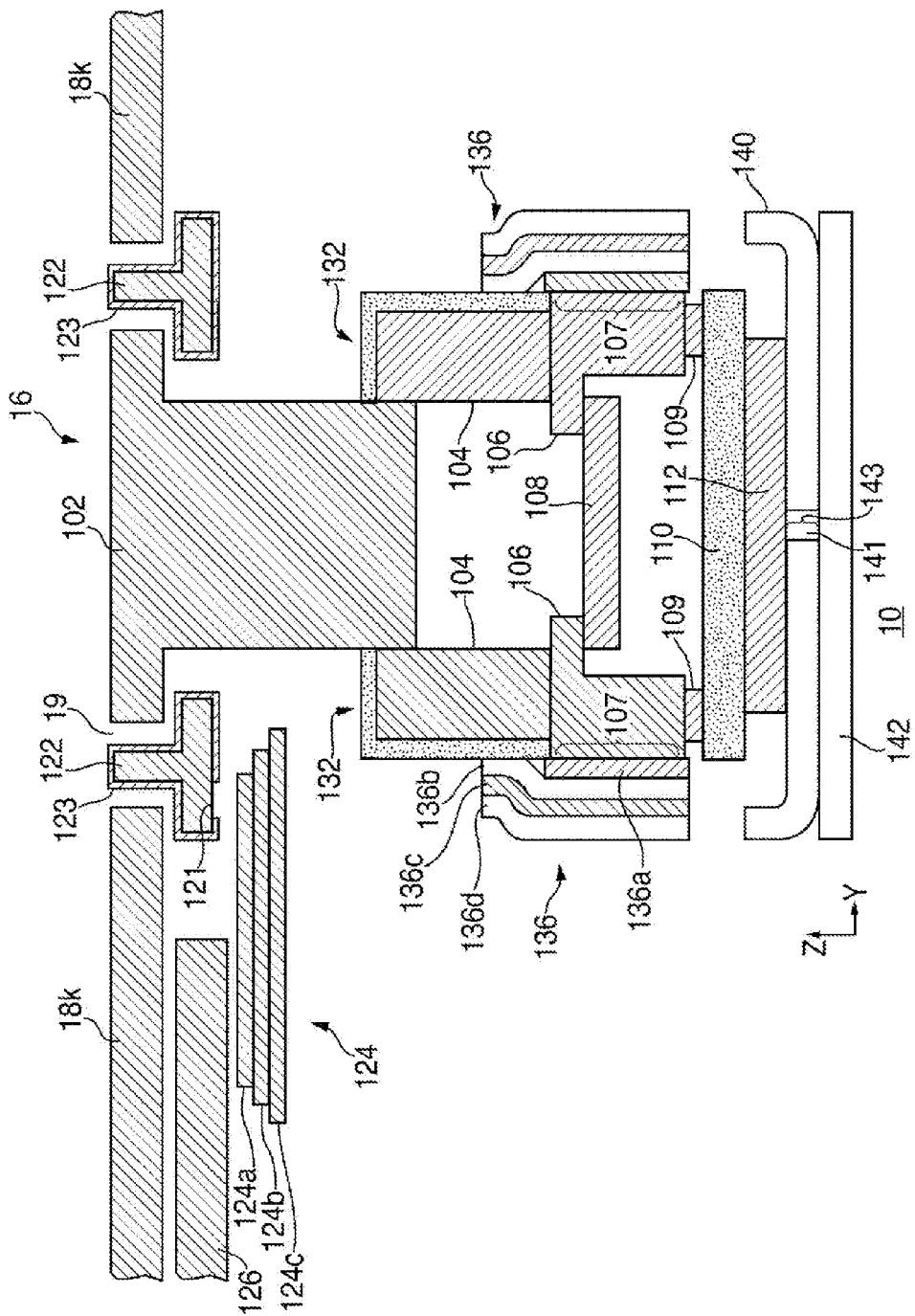
FIG. 14A is a cross-sectional view similar to FIG. 14 of an alternative embodiment of the invention.

As shown in FIG. 14A, camera assembly 16 may be provided with one or more mechanisms for not only grounding stiffener 112, but also for absorbing shock that might otherwise be applied to stiffener 112. For example, a boot component 140 may be provided about at least a portion of stiffener 112 (e.g., along at least a portion of the bottom of stiffener 112). Boot component 140 may be positioned in between and in contact with both stiffener 112 and a support plate 142. Plate 142 may be any suitable support plate that may be electrically coupled to ground (e.g., similar to plate 126). Boot component 140 may be any suitable component that may electrically couple stiffener 112 to grounded plate 142 for grounding stiffener 112, while it the same time at least partially absorb physical shock. For example, boot component 140 may include silicone or rubber or any other suitable material that may absorb physical shock and lessen any shock that may be received by stiffener 112. Boot component 140 may also include an electrically conductive filler that may electrically couple stiffener 112 to plate 142. For example, boot component 140 may include silicone with a carbon particle filler. Alternatively or additionally, boot component 140 may include an elastomeric connector (e.g., a Zebra™ connector) that may provide an electrical path through boot component 140 and between stiffener 112 and plate 142 while at the same time providing shock and vibration absorption. In some embodiments i portion 141 of boot component 140 between stiffener 112 and plate 142 may be removed such that an electrically conductive wire or cable 143 may directly electrically couple stiffener 112 to plate 142, while boot component 140 may still provide shock and vibration absorption to stiffener 112 and/or an other portion of camera assembly 16.

While there have been described various systems of an electronic device and methods for manufacturing, the same, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up" and "down," "front" and "back," "top" and "bottom," "left" and "right," "length" and "width" and "height," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention.

Therefore, those skilled in the art will appreciate that the invention can be practiced by other than the described embodiments, which are presented for purposes of illustration rather than of limitation.

What is claimed is:

1. An electronic device comprising:
   a housing comprising a housing wall with an opening therethrough:
   a device component assembly positioned at least partially within the housing, wherein a first component of the device component assembly is positioned at least partially within the opening;
   a trim positioned at least partially within the opening and about at least a portion of the first component;
   a grounded device component; and
   a bridge that is electrically coupled to the trim and to the grounded device component.

2. The electronic device of claim 1, wherein the trim retains the at least a portion of the first component within the opening.

3. The electronic device of claim 1, wherein the trim comprises an electrically conductive component.

4. The electronic device of claim 3, wherein the trim comprises a non-conductive coating at least partially about the electrically conductive component.

5. The electronic device of claim 4, wherein an exposed portion of the electrically conductive component of the trim is not coated by the non-conductive coating.

6. The electronic device of claim 5 wherein the bridge is electrically coupled to the exposed portion of the electrically conductive component of the trim.

7. The electronic device of claim 1, wherein the trim is not directly electrically coupled to any component of the electronic device except for the bridge.

8. The electronic device of claim 1, wherein the grounded device component comprises a reinforcement plate that reinforces a portion of the housing.

9. The electronic device of claim 1, wherein the bridge comprises an electrostatic discharge adhesive.

10. The electronic device of claim 1, wherein the device component assembly comprises a camera component assembly and wherein the first component of the device component assembly comprises a lens component of the camera component assembly.

11. An electronic device comprising:
 a device component assembly comprising:
  a substrate;
  a first component coupled to a top surface of the substrate; and
  a shield provided about at least a portion of the first component, wherein the shield, is electrically coupled to the substrate; and
 a wrap comprising:
  an inner non-conductive layer provided along at least one side surface of the substrate, wherein the inner non-conductive layer prevents at least one exposed trace on the at least one side surface of the substrate from being shorted; and
  a conductive layer provided about the inner non-conductive layer, wherein the conductive layer is electrically coupled to the shield.

12. The electronic device of claim 11, wherein a portion of the conductive layer extends past the inner non-conductive layer adjacent to a location where the substrate is coupled to at least one of the shield and the first component.

13. The electronic device of claim 11, wherein the conductive layer comprises an electrostatic discharge adhesive.

14. The electronic device of claim 11, wherein the wrap further comprises a cosmetic layer provided over an entire side of the conductive layer.

15. The electronic device of claim 14, further comprising a housing having a housing wall with an opening therethrough, wherein:
 the device component assembly is positioned at least partially within the housing;
 at least one component of the device component assembly is positioned at least partially within the opening; and
 the color of the cosmetic layer matches the color of at least one of a portion of a trim positioned within the opening and a portion of a device element positioned along the inner surface of the housing wall.

16. The electronic device of claim 11, further comprising a stiffener positioned below the substrate for supporting the substrate, wherein the conductive layer is electrically coupled to the stiffener.

17. The electronic device of claim 11, wherein the inner non-conductive layer extends down under the stiffener and back up alone another side surface of the substrate.

18. The electronic device of claim 17, wherein:
 a portion of the conductive layer passes through an opening in the inner non-conductive layer under the stiffener; and
 the portion of the conductive layer is electrically coupled to the stiffener.

19. The electronic device of claim 11, further comprising:
 a stiffener positioned below the substrate for supporting the substrate; and
 an arm extending between the shield and the stiffener for electrically coupling the shield to the stiffener.

20. The electronic device of claim 19, wherein the arm extends around a portion of the wrap that is provided along the device component assembly between the shield and the stiffener.

21. The electronic device of claim 11, further comprising:
 a grounding component;
 a stiffener positioned below the substrate for supporting the substrate; and a boot component provided about at least a portion of the stiffener, wherein the hoot component absorbs physical shock and electrically couples the stiffener to the grounding component.

22. The electronic device of claim 21, wherein the boot component comprises a shock absorbing material having an electrically conductive filler.

23. The electronic device of claim 21, wherein the boot component comprises silicone with a carbon particle filler.

24. The electronic device of claim 21, wherein:
 the boot component comprises a shock absorbing material and a hole therethough; and
 an electrically conductive wire extends through the hole for electrically coupling the stiffener to the grounding component.

25. The electronic device of claim 11, wherein the device component assembly comprises a camera component assembly.

26. The electronic device of claim 25, wherein the first component of the device component assembly comprises a motor for a lens component of the camera component assembly.

* * * * *

UNITED STATES PATENT AND TRADEMARK OFFICE
CERTIFICATE OF CORRECTION

| | |
|---|---|
| PATENT NO. | : 8,993,899 B2 |
| APPLICATION NO. | : 14/248150 |
| DATED | : March 31, 2015 |
| INVENTOR(S) | : Shayan Malek et al. |

Page 1 of 1

It is certified that error appears in the above-identified patent and that said Letters Patent is hereby corrected as shown below:

On the Title Page

In the abstract, line 4, delete "shield and electronic" and insert -- shield an electronic --.

In the Claims

In claim 17, column 18, line 9, delete "back up alone" and insert -- back up along --.

In claim 21, column 18, line 27, delete "wherein the hoot component" and insert -- wherein the boot component --.

Signed and Sealed this
Twenty-first Day of July, 2015

Michelle K. Lee
*Director of the United States Patent and Trademark Office*